(12) United States Patent
Chen et al.

(10) Patent No.: US 11,133,568 B2
(45) Date of Patent: *Sep. 28, 2021

(54) SEMICONDUCTOR PACKAGE STRUCTURE HAVING ANTENNA MODULE

(71) Applicant: SJ Semiconductor (Jiangyin) Corporation, Jiangyin (CN)

(72) Inventors: Yenheng Chen, Jiangyin (CN); Chengtar Wu, Jiangyin (CN); Chengchung Lin, Jiangyin (CN)

(73) Assignee: SJ SEMICONDUCTOR (JIANGYIN) CORPORATION, Jiangyin (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/233,040

(22) Filed: Dec. 26, 2018

(65) Prior Publication Data
US 2019/0198973 A1 Jun. 27, 2019

(30) Foreign Application Priority Data

Dec. 27, 2017 (CN) .......................... 201721855634.0

(51) Int. Cl.
*H01L 23/48* (2006.01)
*H01L 23/52* (2006.01)
(Continued)

(52) U.S. Cl.
CPC ..... *H01Q 1/2283* (2013.01); *H01L 23/49811* (2013.01); *H01L 23/49822* (2013.01);
(Continued)

(58) Field of Classification Search
CPC ......... H01L 23/49811; H01L 23/49822; H01L 23/5226; H01L 23/53228; H01L 23/53257; H01L 23/5386; H01L 23/66; H01L 24/14; H01L 24/95; H01L 23/293; H01L 23/3128; H01L 23/5384; H01L 23/562; H01L 23/043; H01L 23/488; H01L 23/28; H01L 23/49838; H01L 21/56; H01L 2225/06513; H01L 2225/06517; H01L 31/0203; H01L 31/048; H01L 33/52; H01Q 1/36; H01Q 1/364; H01Q 21/08
(Continued)

(56) References Cited

U.S. PATENT DOCUMENTS

| | | | |
|---|---|---|---|
| 2009/0146281 A1* | 6/2009 | Jung ................. | H01L 23/49816 257/678 |
| 2014/0061903 A1* | 3/2014 | Chen ................. | H01L 23/49822 257/738 |

(Continued)

*Primary Examiner* — Kimberly N Rizkallah
*Assistant Examiner* — Dilinh P Nguyen
(74) *Attorney, Agent, or Firm* — Alston & Bird LLP

(57) ABSTRACT

A semiconductor package structure having an antenna module includes: a substrate, having a first surface, a second surface, and at least one via hole made by a laser running through the substrate; a rewiring layer, disposed on the first surface of the substrate; metal bumps, disposed on the rewiring layer and electrically connected to the rewiring layer; a semiconductor chip, disposed on and electrically connected to the rewiring layer; a conductive column, filling the via hole, and an antenna module, disposed on the second surface of the substrate and electrically connected to the metal bumps through the conductive column and the rewiring layer.

11 Claims, 5 Drawing Sheets

(51) Int. Cl.
| | |
|---|---|
| *H01L 29/40* | (2006.01) |
| *H01Q 1/22* | (2006.01) |
| *H01L 23/532* | (2006.01) |
| *H01L 23/538* | (2006.01) |
| *H01L 23/522* | (2006.01) |
| *H01L 23/498* | (2006.01) |
| *H01L 23/00* | (2006.01) |
| *H01Q 1/36* | (2006.01) |
| *H01L 23/66* | (2006.01) |
| *H01Q 21/08* | (2006.01) |
| *H01L 23/15* | (2006.01) |

(52) U.S. Cl.
CPC ...... *H01L 23/5226* (2013.01); *H01L 23/5386* (2013.01); *H01L 23/53228* (2013.01); *H01L 23/53257* (2013.01); *H01L 23/66* (2013.01); *H01L 24/14* (2013.01); *H01L 24/95* (2013.01); *H01Q 1/36* (2013.01); *H01Q 1/364* (2013.01); *H01Q 21/08* (2013.01); *H01L 23/15* (2013.01); *H01L 23/49816* (2013.01); *H01L 2223/6677* (2013.01); *H01L 2224/16227* (2013.01); *H01L 2224/32225* (2013.01); *H01L 2224/73204* (2013.01); *H01L 2224/92125* (2013.01); *H01L 2924/15321* (2013.01)

(58) Field of Classification Search
USPC .......................... 257/690, 778, 782, 786, 787
See application file for complete search history.

(56) References Cited

U.S. PATENT DOCUMENTS

| | | | |
|---|---|---|---|
| 2014/0225276 A1* | 8/2014 | Ho | ........................ H01L 23/481 257/774 |
| 2017/0048981 A1* | 2/2017 | Hu | ........................ H01L 25/117 |

* cited by examiner

SEMICONDUCTOR PACKAGE STRUCTURE HAVING ANTENNA MODULE

CROSS REFERENCES TO RELATED APPLICATIONS

This application claims the benefit of priority to Chinese Patent Application No. CN2017218556340, entitled "Semiconductor Packaging Structure Having Antenna Module", filed with SIPO on Dec. 27, 2017, the contents of which are incorporated herein by reference in its entirety.

TECHNICAL FIELD

The present disclosure relates to the field of semiconductor packaging, and in particular, to a semiconductor package structure having an antenna module.

BACKGROUND

Along with increased functions, performance, integration level of integrated circuits, and emergence of new integrated circuits, packaging technology has been playing an increasingly important role in integrated circuit products, amounting to a higher proportion in the value of entire electronic systems. At the same time, critical dimension of integrated circuits has reached a nanometer level, and transistors are designed with higher density and higher clock frequencies, leading to shrinking packaging sizes.

Fan-out wafer level packaging (FOWLP) technology has the advantages of miniaturization, low cost and high integration level, as well as better performance and higher energy efficiency. FOWLP has become an important packaging method for electronic devices such as in high-requirement mobile/wireless networks, and one of the most promising packaging technologies at present. In addition, considering communication effect, radio frequency chips are always provided with antennas for use. However, most of the existing radio frequency antennas are laid out directly on PCB or printed circuit board during layout design for radio frequency function modules. Optionally interfaces for external antennas are reserved for PCB during layout design. In order to ensure proper antenna gain, leaving antenna out on PCB is done consuming more PCB area. In addition, it is difficult to control the chip warpage from fan-out wafer level packaging processes using materials such as plastic packaging. If the warpage situation is difficult to be alleviated, material shrinkage or swelling caused slippage and misalignment in the packaging process become hard to control. In addition, low heat conductivity in plastics leads to overheating.

Therefore, it is necessary to provide a low-cost solution to reduce warpage and overheating for semiconductor packaging structures with antennas.

SUMMARY

The present disclosure provides a semiconductor package structure having an antenna module. The semiconductor package structure comprises: a substrate, having a first surface and a second surface opposite to the first surface, wherein at least one via hole running through the first surface and the second surface is formed in the substrate; a rewiring layer, disposed on the first surface of the substrate; a plurality of metal bumps, disposed on and electrically connected to the rewiring layer; a semiconductor chip, disposed on and electrically connected to the rewiring layer, where a lateral spacing is configured between the semiconductor chip and each of the plurality of metal bumps; a conductive column, filling the via hole; and an antenna module, disposed on the second surface of the substrate, where the antenna module is electrically connected to the metal bump sequentially through the conductive column and the rewiring layer.

In a preferred embodiment of the present disclosure, the semiconductor package structure further comprises an underfill layer, and the underfill layer fills a gap between the semiconductor chip and the rewiring layer.

In a preferred embodiment of the present disclosure, the substrate comprises a quartz glass substrate or a sapphire substrate.

In a preferred embodiment of the present disclosure, the rewiring layer comprises: a dielectric layer, bonded onto the first surface of the substrate; at least one metal wire layer, where the metal wire layer is patterned into the dielectric layer; and an under-bump metal layer, patterned into the dielectric layer, wherein the under-bump metal layer is electrically connected to the at least one metal wire layer, where the plurality of metal bump is disposed directly on the under-bump metal layer.

In a preferred embodiment of the present disclosure, the plurality of metal bumps each comprises: a copper column, a nickel layer disposed on a top surface of the copper column, and a solder bump disposed on the nickel layer.

In a preferred embodiment of the present disclosure, the antenna module comprises a plurality of antenna units having a same contour, and arranged with a space from each other.

In a preferred embodiment of the present disclosure, the plurality of antenna units each comprises a central portion and a peripheral portion surrounding the central portion, and a space is arranged between the peripheral portion and the central portion, where the central portion is electrically connected to one of the plurality of metal bump through the conductive column and the rewiring layer.

In a preferred embodiment of the present disclosure, a shape of the central portion may be a circle, an outer circumvent of the peripheral portion is a square, and an inner circumvent of the peripheral is a circle.

In a preferred embodiment of the present disclosure, the plurality of antenna units is arranged in an array.

In a preferred embodiment of the present disclosure, the antenna module comprises at least two layers of antenna module unit, and each layer of the antenna module unit comprises at least one antenna unit.

DESCRIPTIONS OF REFERENCE NUMERALS

Figure 1:
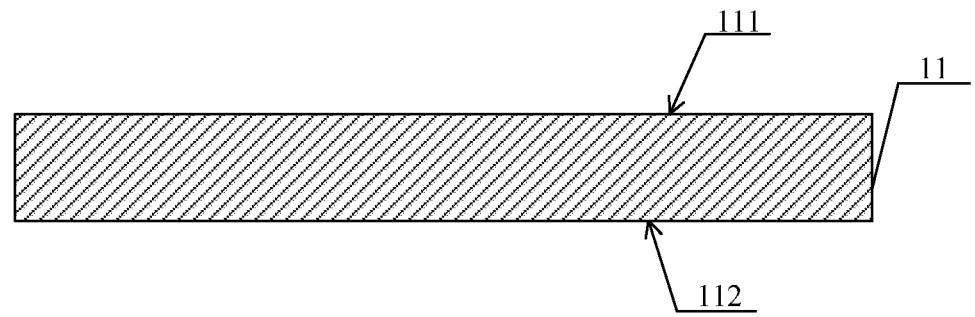
FIG. 1 is a substrate of a semiconductor package structure.

| | |
|---|---|
| 11 | Substrate |
| 111 | First surface |
| 112 | Second surface |
| 21 | Rewiring layer |
| 211 | Under-bump metal layer |
| 212 | Dielectric layer |
| 213 | Metal wire layer |
| 31 | Metal bump |
| 41 | Semiconductor chip |
| 51 | underfill layer |
| 61 | Via hole made by a laser |
| 71 | Conductive column |
| 81 | Antenna unit |
| 811 | Central portion |
| 812 | Peripheral portion |
| 91 | Bonding layer |
| 92 | Fixing ring |

DETAILED DESCRIPTION OF THE PREFERRED EMBODIMENTS

Implementations of the present disclosure are described below by using particular and specific embodiments, and a person skilled in the art can easily understand other advantages and efficacy of the present disclosure from content disclosed in the specification.

It should be known that, structures, proportions, sizes and the like drawn in drawings appended to this specification are all only used to be understood and read by a person skilled in the art in cooperation with content disclosed in the specification, but are not used to limit limitation conditions that the present disclosure may implement, and therefore do not have a technically essential meaning. Any modification in a structure, change in a proportion relationship or adjustment in a size, without affecting the efficacy that the present disclosure can generate and the object that the present disclosure can achieve, should still fall within the scope that the technical content disclosed in the present disclosure can cover. Moreover, terms such as "upper", "lower", "left", "right", "middle" and "a" cited in this specification are also only used to facilitate clear description, but are not used to limit the scope that the present disclosure may implement, and change or adjustment in a relative relationship between the terms, without essentially changing the technical content, should also be considered as the scope that the present disclosure may implement.

As shown in FIG. 1 to FIG. 10, the present disclosure provides a semiconductor package structure having an antenna module. The semiconductor package structure comprises: a substrate 11, having a first surface 111 and a second surface 112 opposite to the first surface, wherein at least one via hole made by a laser 61 running through the first surface and the second surface is formed in the substrate 11; a rewiring layer 21, disposed on the first surface 111 of the substrate; a metal bump 31, disposed on the rewiring layer 21 and electrically connected to the rewiring layer 21; a semiconductor chip 41, disposed on a surface of the rewiring layer 21 and electrically connected to the rewiring layer 21, wherein a spacing exists between the semiconductor chip 41 and the metal bump 31; a conductive column 71, filling the via hole made by a laser 61, and running through the substrate 11 vertically; and an antenna module, disposed on the second surface 112 of the substrate, wherein the antenna module is electrically connected to the metal bump 31 sequentially through the conductive column 71 and the rewiring layer 21.

In an example, the substrate 11 may be a quartz glass substrate or a sapphire substrate.

Specifically, the present disclosure provides a semiconductor package structure, wherein the substrate 11 is preferably a quartz substrate or a sapphire substrate. On one hand, since the quartz sheet has no warpage problem, the semiconductor chip can be prevented from experiencing problems such as fracture, warpage and breaking in a subsequent preparation process; on the other hand, quartz has good heat conduction, which is ten to hundred times better than that of packaging material, thereby a heat effect problem in a packaging process is solved. In addition, in other examples, the substrate may also be any other glass substrates, which is not specifically limited herein.

The shape of the substrate 11 may be set according to actual needs. The shape of the substrate 11 may be a rectangular shape, a circular shape, a hexagonal shape, a triangular shape, a trapezoidal shape or the like, which is not limited herein. The via hole made by a laser 61 is further formed in the substrate 11. In an example, the via hole made by a laser 61 may be formed in the substrate by using a laser drilling process, or the via hole made by a laser 61 may be formed in the substrate 11 by using a process such as etching, a cross-sectional shape of the via hole made by a laser 131 may be set according to an actual need. Preferably, in this embodiment, the cross-sectional shape of the via hole made by a laser 131 may be an inverted trapezoid. Certainly, in other examples, the shape of the via hole made by a laser 131 may be a rectangle or the like.

It should be noted that, when the metal wire layer 213 in the rewiring layer 21 corresponding to a location of the via hole made by a laser 61 is not exposed from a surface of a dielectric layer adjacent to the second surface of the substrate 11, after running through the substrate 11, the via hole made by a laser 61 further extends into the dielectric layer 212 of the rewiring layer 21, so as to ensure that a part of the metal wire layer 213 may be exposed from the via hole made by a laser 61.

Specifically, the semiconductor chip 41 may be any kind of semiconductor function chip, and a connection bonding pad electrically leading out a function device inside the semiconductor chip 41 is further formed on a front surface of the semiconductor chip 41. The connection bonding pad is exposed from the front surface of the semiconductor chip. Preferably, a top surface of the connection bonding pad is leveled with a top surface of the semiconductor chip. The spacing between the semiconductor chip 41 and the metal bump 31 refers to the semiconductor chip is spaced with the metal bump at a position that protrudes out of the metal wiring layer on the surface of the metal wiring layer, i.e., the exposed exterior part is not conductive.

In addition, since structures such as the antenna module, the redistribution layer, the metal bump and the semiconductor chip are provided on two opposite side surfaces of the substrate in the present disclosure, reasonable design of the antenna structure can be performed, which will facilitate the decrease of the volume of the entire semiconductor packaging structure.

As an example, the semiconductor packaging structure further comprises an underfill layer 51, and the underfill layer 51 fully fills the gap between the semiconductor chip 41 and the redistribution layer 21.

Specifically, the underfill layer 51 is filled between the semiconductor chip 41 and the adjacent redistribution layer 21, and completely covers the surface, close to the redistribution layer 21, of the semiconductor chip 41. Preferably, the underfill layer 51 exceeds the surface of the semiconductor chip and extends to the periphery of the metal bump on the two sides of the semiconductor chip, the material of the underfill layer 51 includes filling adhesive, the underfill layer 51 can protect the adhesion force and stability of the semiconductor chip in the process, can further alleviate the problem of stress concentration at the edge and the apex of the semiconductor chip, and can prevent the semiconductor chip from being broken, and thus improving the packaging reliability.

In an example, the rewiring layer 21 includes: a dielectric layer 212, bonded onto the first surface 111 of the substrate 11; at least one metal wire layer 213, disposed inside the dielectric layer 212; and an under-bump metal layer 211, disposed on a surface of the dielectric layer 212, and extending into the dielectric layer 212 to be electrically connected to the metal wire layer 213, wherein the metal bump 31 is disposed on the under-bump metal layer 211.

Specifically, in an example, the rewiring layer 21 comprises a metal wire layer 213, a dielectric layer 212 and an under-bump metal layer 211. In an example, a process for manufacturing the under-bump metal layer comprises: first forming a metal wire layer on a surface of the substrate, and then forming a dielectric layer on the surface, where the dielectric layer encloses the metal wire layer. Alternatively, firstly forming a dielectric layer; then performing processes such as etching and filling; after that, forming an opening in the dielectric layer, such that the under-bump metal layer can be prepared. Of course, the redistribution layer may be any redistribution layer structure commonly used in the art, or a redistribution layer capable of realizing an electric connection leading-out function prepared by other processes.

In addition, in another example, the dielectric layers may have two or more layers, and the metal wire layers may have two or more layers. For example, a first insulation layer is formed on a surface of the substrate; the metal wire layer is formed on a surface of the first insulation layer; a second insulation layer is formed on a top surface of the first insulation layer, and the second insulation layer completely covers the metal wire layer; an opening is formed in the second insulation layer, and the metal wire layer is exposed from the opening; and the under-bump metal layer is formed in the opening.

Specifically, the material of the metal wire layer 213 may be, but not limited to, one of copper, aluminum, nickel, gold, silver and titanium or a laminated layer formed by more than two of the above material. The material of the dielectric layer 212 may be a low-k dielectric material, and may specifically comprise any one of epoxy resin, silica gel, PI (polyimide), PBO (Polybenzoxazole), BCB (Benzocyclobutene), silicon oxide, phosphosilicate glass and fluorine-containing glass.

In an example, a structure of the metal bump 31 comprises: a copper column, a nickel layer disposed on a top surface of the copper column and a solder bump disposed on the nickel layer.

Specifically, the metal bump 31 may be a metal column, a solder ball, or a combination of a copper column and solder metal, or the like. In this embodiment, a metal bump 31 is provided, and a manufacturing method comprises: manufacturing an under-bump metal layer on the rewiring layer; forming a copper column on a surface of the under-bump metal layer; forming a metal blocking layer on a surface of the copper column; and forming solder metal on a surface of the metal blocking layer, and forming a solder bump on the surface of the metal blocking layer by using a high-temperature reflow process.

Figure 7:
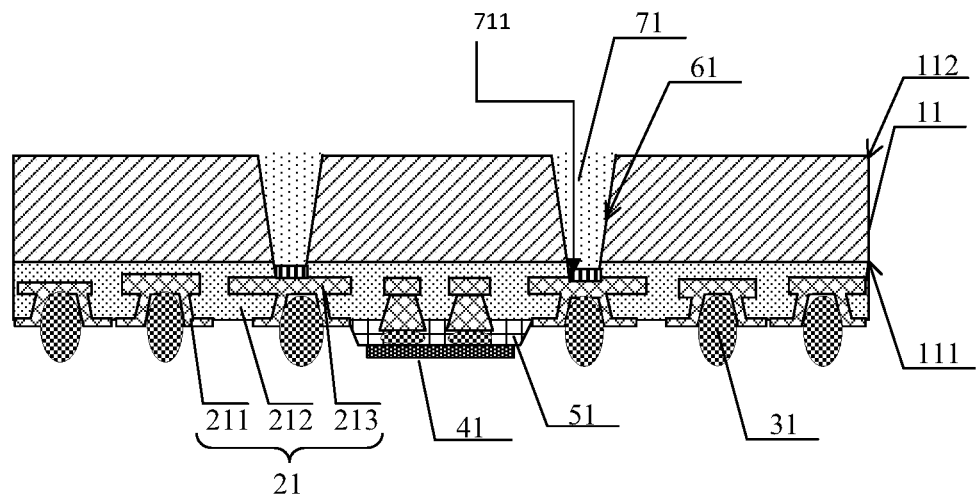
FIG. 7 is a cross sectional view of the semiconductor package structure after a conductive column is formed according to the present disclosure.

The metal barrier layer comprises a nickel layer 711 shown in FIG. 7, and a material of the solder bump comprises one of lead, tin and silver, or an alloy of the foregoing solder metal.

In an example, the antenna module comprises a plurality of antenna units 81, the antenna units 81 have a same shape, and a spacing exists between adjacent antenna units 81.

Specifically, the semiconductor package structure further comprises an antenna module, the antenna module is electrically connected to the rewiring layer on another surface of the substrate by using the conductive column, and then another electrical connection function is further performed, where a process for forming the antenna module may be any process well known by a person of ordinary skill in the art. For example, a dielectric layer of an antenna pattern having a window is first formed, where at least the conductive column is exposed from the window pattern, and then sputtering, electroplating and the like are performed to form a final antenna.

Specifically, the antenna module comprises at least one antenna unit 81, and the shape of the antenna unit may be block-shaped or spiral. Certainly, the antenna module may comprise a plurality of antenna units 81, such as 10 to 100 antenna units 81, depending on an actual requirement. When there are two or more antenna units, shapes of the different antenna units 81 may be the same or different, depending on an actual requirement. Additionally, when the antenna unit 81 is a block-shaped antenna, the block-shaped antenna may be a metal block; and when the antenna unit 81 is a spiral antenna, the spiral antenna may be formed by winding a metal wire into a spiral shape. Preferably, contours of the antenna units are the same, which can implement even control, and it is convenient to perform proper layout according to an actual requirement.

Additionally, a material of the antenna unit comprises but is not limited to any of copper, aluminum, nickel, gold, silver, tin and titanium, or the antenna unit is a laminated material layer formed by two or more of the foregoing material layers, and the laminated material layer may be prepared by using any of a physical vapor deposition process (PVD), a chemical vapor deposition process (CVD), sputtering, electroplating and chemical plating. Additionally, a material of the conductive column 71 is preferably the same as a material of the antenna module.

Specifically, the first surface of the substrate 11 may be spin-coated with a conductive adhesive by using a conductive adhesive printing process, so that the conductive adhesive enters the via hole made by a laser 61 to form the conductive column 71. Certainly, in other examples, a conductive material (for example, metal, metal compound and the like) may alternatively be deposited in the via hole made by a laser 61 by using a process such as a physical vapor deposition process, a chemical vapor deposition process (CVD), or plasma-enhanced CVD to form the conductive column 71. Preferably, a top surface of the conductive column 71 is leveled with the first surface of the substrate 11.

In an example, the antenna unit 81 comprises a central portion 811 and a peripheral portion 812 surrounding the central portion 811, and a spacing is disposed between the peripheral portion 812 and the central portion 811, wherein the central portion 811 is electrically connected to the metal bump 31 sequentially through the conductive column 71 and the rewiring layer 21.

In an example, the shape of an outer edge of the central portion 811 may be a circle, the shape of an outer edge of the peripheral portion 812 may be a square, and the shape of an edge of the peripheral portion 812 close to a side of the central portion 811 may be a circle.

Specifically, in this example, each of the antenna units forms a planar inverted F-shaped antenna structure, that is, a planar inverted F-shaped antenna (PIFA). The antenna unit 81 is formed by two parts, comprising a central portion and a peripheral portion surrounding the central portion. The central portion 811 is directly electrically connected to the conductive column 71, and a spacing disposed between the peripheral portion 812 and the central portion 811 is shown as D in FIG. 9, which may range from 10 μm to 200 μm or may be in other ranges. In this example, the spacing D is preferably 80 μm to 150 μm, so as to form an optimal configuration. Additionally, two antenna units 81 are preferably disposed around the semiconductor chip.

In an example, the antenna units 81 are arranged on the second surface 112 of the substrate 11 in an array, in a ring shape or at irregular intervals.

Specifically, the antenna units are evenly arranged, and a gap is disposed between the antenna units 81. This design manner is simple in process, other additional processes do not need to be performed on the antenna units having a same contour, and the antenna units are suitable for mass production. Moreover, antenna signals are uniform, and the losses are small. Additionally, a gap between adjacent antenna units is set according to an actual situation. For example, the gap is in a plane in which a surface of the substrate lies, along a longitudinal direction or a transverse direction perpendicular to a longitudinal direction, a distance between centers of adjacent antenna units may be set at will, and sizes of the antenna units may also be selected at will. Certainly, an arrangement manner of the antenna units may be set at will according to a requirement, antenna units having a relatively large density may be set at required locations, or the antenna units may be arranged irregularly, which is not specifically limited herein.

In an example, the antenna module comprises at least two antenna module unit layers, and each of the antenna module unit layers comprises at least one antenna unit 81.

Specifically, the antenna module may be formed through single-layered arrangement or certainly multi-layered arrangement of several antenna units 81 on the second surface 112 of the substrate 11, the multi-layered arrangement comprising two or more antenna unit layers, and then design of antenna units having a proper quantity and a proper shape is performed on each of the antenna unit layers, where two adjacent antenna unit layers are separated by the dielectric layer, and a conductive plug formed in the dielectric layer implements electrical connection between different layers. Therefore, flexible antenna layout design may be performed according to a specific requirement.

Figure 2:
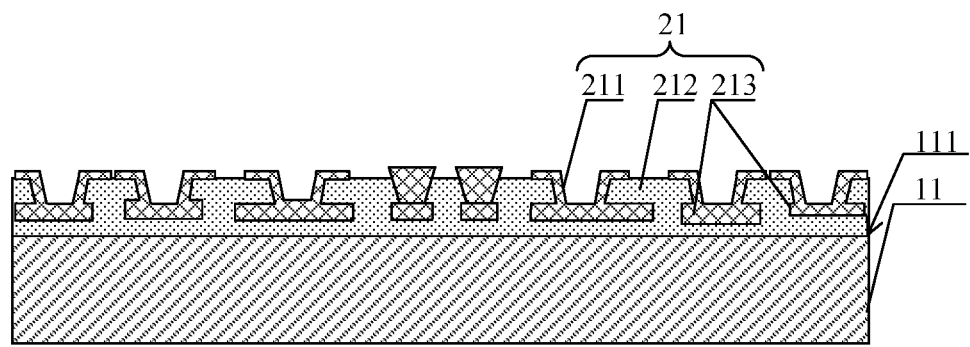
FIG. 2 is a cross sectional view of the semiconductor package structure after rewiring layer is formed according to the present disclosure.
Figure 3:
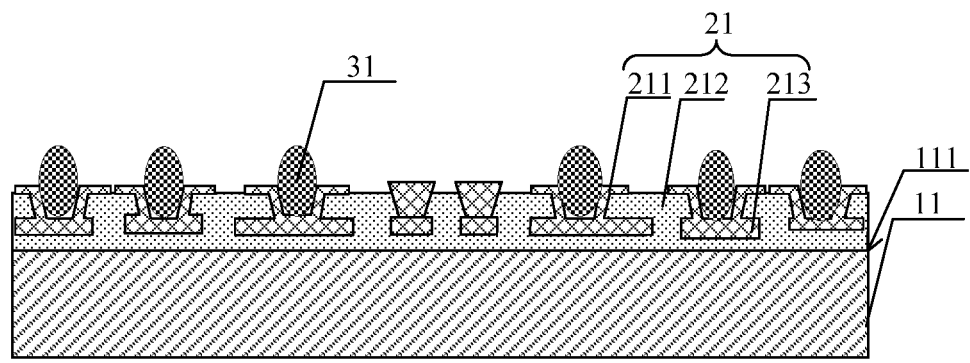
FIG. 3 is a cross sectional view of the semiconductor package structure after a metal bump is formed according to the present disclosure.
Figure 4:
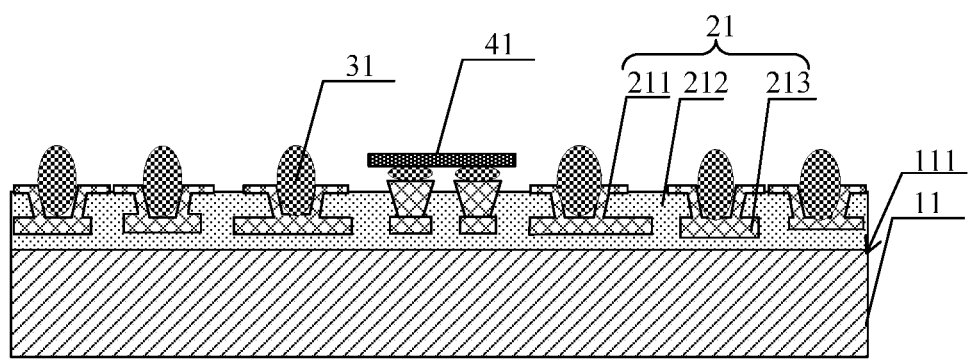
FIG. 4 is a cross sectional view of the semiconductor package structure after a semiconductor chip is formed according to the present disclosure.
Figure 5:
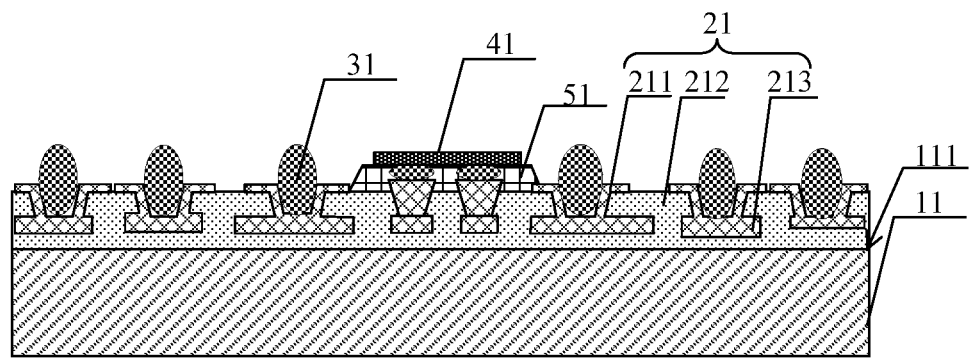
FIG. 5 is a cross sectional view of the semiconductor package structure after an underfill layer is formed during preparation according to the present disclosure.
Figure 6:
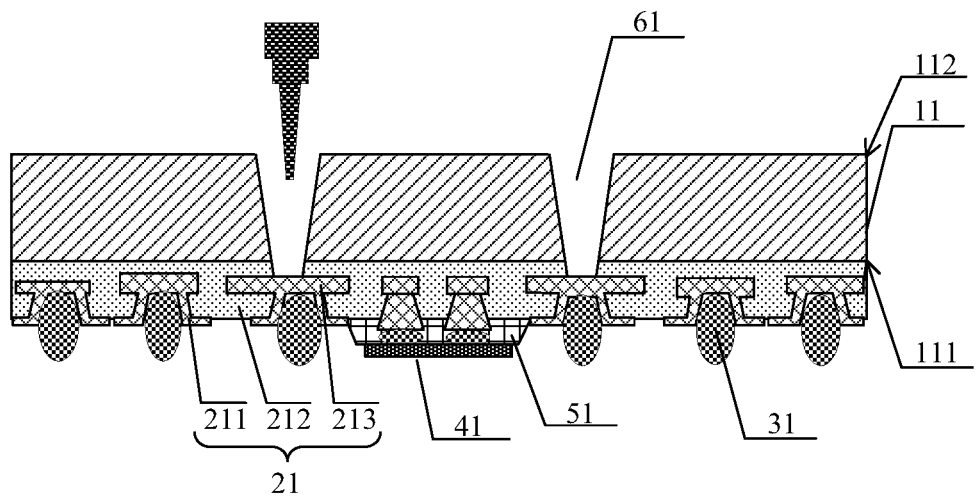
FIG. 6 is a cross sectional view of the semiconductor package structure after a via hole made by a laser is formed during preparation according to the present disclosure.
Figure 8:
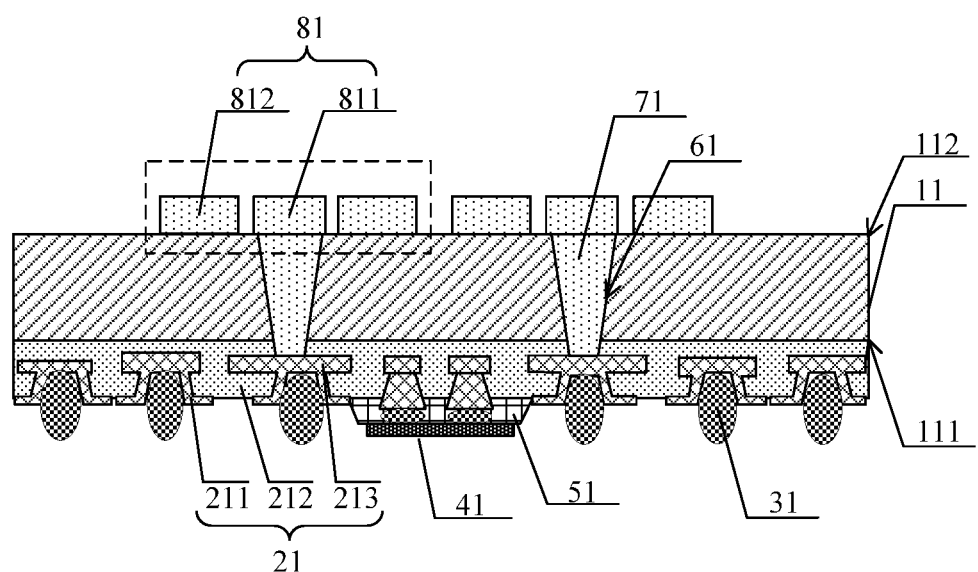
FIG. 8 is a cross sectional view of the semiconductor package structure after an antenna module is formed according to the present disclosure.
Figure 9:
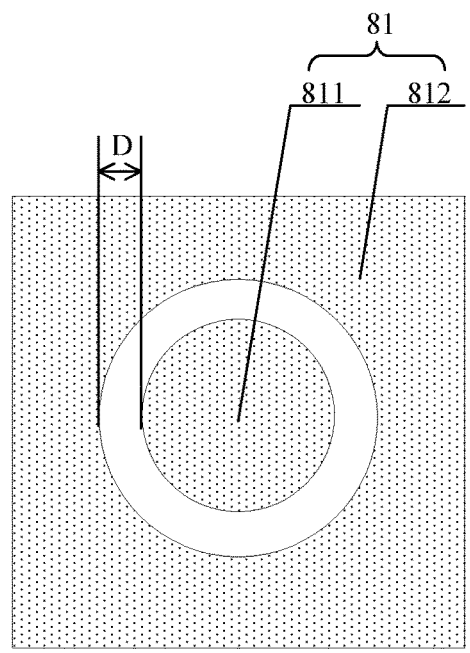
FIG. 9 is a top view of the antenna module taken from the dashed lined enclosed box in FIG. 8.
Figure 10:
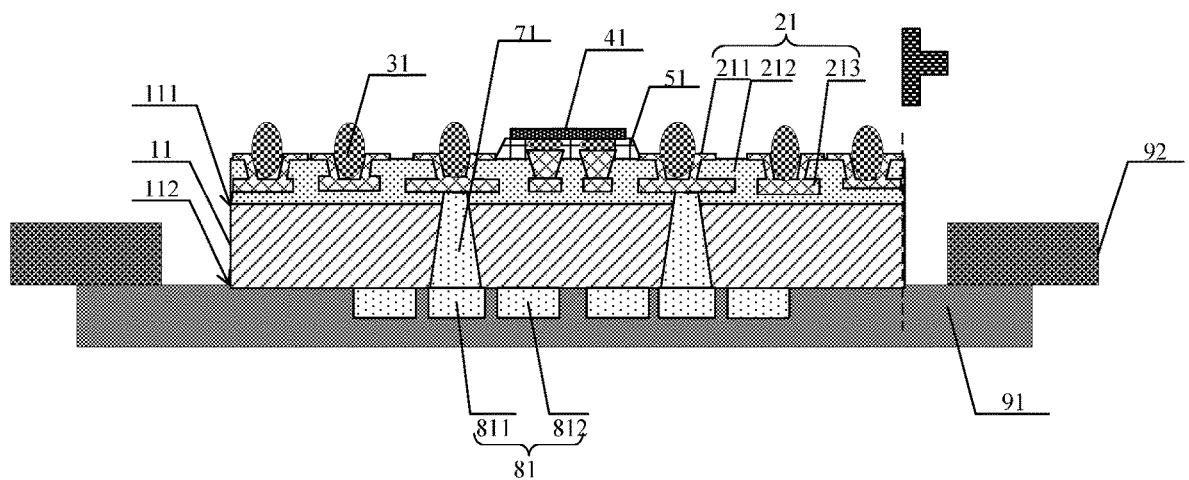
FIG. 10 is the cross sectional view of the finished semiconductor package structure, according to the present disclosure.

Additionally, it should be further noted that, this disclosure further provides a method for preparing the foregoing semiconductor package structure having an antenna module. FIG. 1 shows a provided substrate 11. FIG. 2 shows a structure after a rewiring layer 21 (top side RDL) is prepared. Then, as shown in FIG. 3, a metal bump 31 (ball mount) is prepared. Then, a process (die bonder) of bonding a semiconductor chip 41 shown in FIG. 4 is performed. Then, a underfill layer 51 (dispenser) is formed, as shown in FIG. 5. Then, a via hole made by a laser 61 (backside laser drill) is prepared, as shown in FIG. 6. Then, a conductive column 71 (metal glue printer) is formed by means of deposition, as shown in FIG. 7. Then, an antenna module (antenna layer) is prepared, as shown in FIG. 8 and FIG. 9. Certainly, as shown in FIG. 10, the method further comprises a step of performing wafer sawing (wafer mount & dicing saw or laser saw), where in a sawing process, a bonding layer and a fixing ring are further comprised, thereby obtaining the semiconductor package structure of the present disclosure.

To sum up, in the present disclosure, the semiconductor package structure having an antenna module comprises: a substrate, having a first surface and a second surface opposite to the first surface, wherein at least one via hole made by a laser running through the first surface and the second surface is formed in the substrate; a rewiring layer, disposed on the first surface of the substrate; a metal bump, disposed on the rewiring layer and electrically connected to the rewiring layer; a semiconductor chip, disposed on a surface of the rewiring layer and electrically connected to the rewiring layer, where a spacing exists between the semiconductor chip and the metal bump; a conductive column, filling the via hole made by a laser, and running through the substrate vertically; and an antenna module, disposed on the second surface of the substrate, where the antenna module is electrically connected to the metal bump sequentially through the conductive column and the rewiring layer. By using the foregoing solution, by disposing the antenna module and the rewiring layer on two opposite surfaces of the substrate, and based on characteristic design of an electrical connection between the antenna module and the semiconductor chip by using the conductive column in the substrate, the rewiring layer and the metal bump, the semiconductor structure having an antenna module of the present disclosure may therefore facilitate proper packaging layout design. In the present disclosure, the substrate is quartz glass or the like, which has good heat conductivity ten times to hundred times better than that of a packaging material, therefore the problem of heat effect is solved. Moreover, as a quartz plate has no warpage problem, it is further ensured that in a subsequent process, the chip is not warped and broken easily. Furthermore, manufacturing is easy, and a yield is improved. The structure of the present disclosure is simple in structure and low in cost, and suitable for mass production. Therefore, the present disclosure effectively overcomes various disadvantages in the prior art and has a high industrial utilization value.

The foregoing embodiments are merely intended to exemplarily describe the principles and efficacy of the present disclosure and are not intended to limit the present disclosure. A person skilled in the art can make modifications or changes to the foregoing embodiments without departing from the spirit and scope of the present disclosure. Therefore, any equivalent modifications or changes completed by a person of common knowledge in the art without departing from the spirit and technical thoughts disclosed in the present disclosure shall still fall within the scope of the claims of the present disclosure.

The invention claimed is:

1. A semiconductor package structure having an antenna module, comprising:
   a substrate, having a first surface and a second surface opposite to the first surface, wherein at least one via hole running through the first surface and the second surface is formed in the substrate;
   a rewiring layer, disposed on the first surface of the substrate;
   a plurality of metal bumps, disposed on and electrically connected to the rewiring layer;
   a semiconductor chip, disposed on and electrically connected to the rewiring layer, wherein a lateral space is configured between the semiconductor chip and each of the plurality of metal bumps;
   a conductive column, filling the via hole; and
   an antenna module, disposed on the second surface of the substrate, wherein the antenna module is electrically connected to the plurality of metal bumps through the conductive columns and the rewiring layer;
   wherein the antenna module comprises a plurality of antenna units having a same contour, and arranged with a space from each other;
   wherein the plurality of antenna units each comprises a central portion and a peripheral portion surrounding the central portion, wherein a space is set between the peripheral portion and the central portion; and
   wherein the central portion is electrically connected to one of the plurality of metal bumps through the conductive column and the rewiring layer.

2. The semiconductor package structure having the antenna module according to claim 1, wherein the semiconductor package structure further comprises an underfill layer, wherein the underfill layer fills a gap between the semiconductor chip and the rewiring layer.

3. The semiconductor package structure having the antenna module according to claim 1, wherein the substrate is a quartz glass substrate or a sapphire substrate.

4. The semiconductor package structure having the antenna module according to claim 1, wherein the rewiring layer comprises:
   a dielectric layer, bonded onto the first surface of the substrate;
   at least one metal wire layer, wherein the metal wire layer is patterned into the dielectric layer; and
   an under-bump metal layer, patterned into the dielectric layer, wherein the under-bump metal layer is electrically connected to the at least one metal wire layer; and
   wherein the plurality of metal bumps is disposed directly on the under-bump metal layer.

5. The semiconductor package structure having the antenna module according to claim 1, wherein the plurality of metal bumps each comprises: a copper column, a nickel layer disposed on a top surface of the copper column, and a solder bump disposed under the nickel layer.

6. The semiconductor package structure having the antenna module according to claim 1, wherein a shape of the central portion is a circle, an outer circumvent of the peripheral portion is a square, and an inner circumvent of the peripheral portion is a circle.

7. The semiconductor package structure having the antenna module according to claim 1, wherein the plurality of antenna units is arranged in an array.

8. The semiconductor package structure having the antenna module according to claim 7, wherein the array is has a ring shape.

9. The semiconductor package structure having the antenna module according to claim 1, wherein the antenna units are arranged irregularly spaced on the second surface of the substrate.

10. The semiconductor package structure having the antenna module according to claim 1, wherein the antenna module comprises at least two layers of antenna module unit, and each layer of the antenna module unit comprises at least one antenna unit.

11. The semiconductor package structure having the antenna module according to claim 1, wherein the via hole is made by laser drilling.

* * * * *